US010694086B2

(12) United States Patent
Hu et al.

(10) Patent No.: US 10,694,086 B2
(45) Date of Patent: Jun. 23, 2020

(54) CAMERA MODULE

(71) Applicant: TDK TAIWAN CORP., Taoyuan (TW)

(72) Inventors: Chao-Chang Hu, Taoyuan (TW); Chen-Hsien Fan, Taoyuan (TW)

(73) Assignee: TDK TAIWAN CORP., Yangmei Taoyuan (TW)

( * ) Notice: Subject to any disclaimer, the term of this patent is extended or adjusted under 35 U.S.C. 154(b) by 0 days.

(21) Appl. No.: 16/141,458

(22) Filed: Sep. 25, 2018

(65) Prior Publication Data
US 2019/0028622 A1  Jan. 24, 2019

Related U.S. Application Data

(63) Continuation of application No. 15/479,662, filed on Apr. 5, 2017, now Pat. No. 10,116,844.

(60) Provisional application No. 62/356,874, filed on Jun. 30, 2016, provisional application No. 62/320,096, filed on Apr. 8, 2016.

(30) Foreign Application Priority Data

Mar. 17, 2017 (TW) .............................. 106108887 A

(51) Int. Cl.
| H04N 5/225 | (2006.01) |
| H05K 1/18 | (2006.01) |
| H01L 27/146 | (2006.01) |
| H05K 1/05 | (2006.01) |

(52) U.S. Cl.
CPC ..... H04N 5/2253 (2013.01); H01L 27/14618 (2013.01); H04N 5/2252 (2013.01); H04N 5/2254 (2013.01); H04N 5/2257 (2013.01); H05K 1/05 (2013.01); H05K 1/181 (2013.01); *H05K 2201/09072* (2013.01); *H05K 2201/10121* (2013.01); *H05K 2201/10151* (2013.01); *H05K 2203/1469* (2013.01)

(58) Field of Classification Search
CPC ..... H01L 27/14618; H05K 1/05; H05K 1/181
See application file for complete search history.

(56) References Cited

U.S. PATENT DOCUMENTS

| 9,449,954 | B2 | 9/2016 | Lin et al. |
| 9,728,853 | B2 | 8/2017 | Hung |
| 2013/0140664 | A1 | 6/2013 | Lo et al. |
| 2014/0339668 | A1 | 11/2014 | Arima et al. |
| 2016/0205304 | A1 | 7/2016 | Oh |
| 2017/0229950 | A1 | 8/2017 | Moto et al. |
| 2017/0295304 | A1 | 10/2017 | Hu et al. |

*Primary Examiner* — Antoinette T Spinks
(74) *Attorney, Agent, or Firm* — Muncy, Geissler, Olds & Lowe, P.C.

(57) ABSTRACT

A camera module is provided, including a lens driving mechanism, a lens unit, a circuit board, and an image sensor. The lens unit is disposed on the lens driving mechanism. The image sensor is disposed on the circuit board. The circuit board includes a metal member, an insulation layer, and a metal wire. The insulation layer is disposed between the metal member and the metal wire, and the metal wire is electrically connected to the image sensor. The lens driving module can drive the lens unit to move relative to the image sensor. The image sensor can catch the light through the lens unit.

12 Claims, 6 Drawing Sheets

CAMERA MODULE

CROSS REFERENCE TO RELATED APPLICATIONS

This application is a Continuation of application Ser. No. 15/479,662, filed on Apr. 5, 2017, which claims the benefit of U.S. Provisional Application No. 62/320,096, filed Apr. 8, 2016, U.S. Provisional Application No. 62/356,874, filed Jun. 30, 2016, and Taiwan Patent Application No. 106108887, filed Mar. 17, 2017.

BACKGROUND OF THE INVENTION

Field of the Invention

The application relates in general to a camera module, and in particular, to a camera module having an image sensor and a circuit board, wherein the image sensor is disposed on the circuit board, and the circuit board includes a metal member.

Description of the Related Art

As technology has advanced, a lot of electronic devices (for example, cameras and smartphones) have the functionality of taking photographs or recording video. These electronic devices have become more commonplace, and have been developed to be more convenient, and thin. More and more choices are provided for users to choose from.

Generally, an electronic device having the functionality of taking photographs or recording video includes a driving module to drive one or more optical lens units to move along an optical axis, so as to facilitate auto-focus and auto-zoom controls. The light can pass through the optical lens units and form an image on an image sensor.

Thus, the flatness of the driving module and the image sensor is important. However, conventional image sensors are supported by the printed circuit board. When the electronic device is assembled or moved, the printed circuit board may be curved. Therefore, the flatness may be reduced.

BRIEF SUMMARY OF INVENTION

To address the deficiencies of conventional products, an embodiment of the invention provides a camera module, including a lens driving mechanism, a lens unit, a circuit board, and an image sensor. The lens unit is disposed on the lens driving mechanism. The image sensor is disposed on the circuit board. The circuit board includes a metal member, an insulation layer, and a metal wire. The insulation layer is disposed between the metal member and the metal wire, and the metal wire is electrically connected to the image sensor. The lens driving module can drive the lens unit to move relative to the image sensor. The image sensor can catch the light through the lens unit.

In some embodiments, the thickness of the metal member exceeds the total thickness of the insulation layer and the metal wire.

In some embodiments, the thickness of the metal member is 0.10 mm-0.35 mm.

In some embodiments, the metal wire is formed on the insulation layer by using a molded interconnect device.

In some embodiments, the metal wire is formed on the insulation layer by coating.

In some embodiments, the metal member and the metal wire have the same coefficient of thermal expansion.

In some embodiments, the image sensor is attached on the insulation layer.

In some embodiments, the camera module further comprises a plurality of lens driving mechanisms, a plurality of lens units, and a plurality of image sensors. The lens units are respectively disposed on the lens driving mechanisms, and the image sensors are disposed on the circuit board, wherein the positions of the lens units respectively correspond to the positions of the image sensors.

In some embodiments, the camera module further comprises a base disposed between the image sensor and the lens unit.

In some embodiments, the base comprises a metal substrate, a first conductive layer electrically connected to the lens driving mechanism, and a first insulation layer disposed between the metal substrate and the first conductive layer.

In some embodiments, the thickness of the metal substrate exceeds the total thickness of the first conductive layer and the first insulation layer.

In some embodiments, the thickness of the metal substrate is 0.10 mm-0.35 mm.

In some embodiments, the base further comprises a second insulation layer and a second conductive layer, wherein the second insulation layer is formed on the metal substrate, the first insulation layer and the second insulation layer are formed on opposite surfaces of the metal substrate, and the second conductive layer is formed on the second insulation layer.

In some embodiments, the thickness of the metal substrate exceeds the total thickness of the second insulation layer and the second conductive layer.

In some embodiments, the second conductive layer is electrically connected to the image sensor.

In some embodiments, the first conductive layer and the second conductive layer are respectively formed on the first insulation layer and the second insulation layer by a manner of molded interconnect device.

In some embodiments, the metal substrate, the first conductive layer, and the second conductive layer have the same coefficient of thermal expansion.

In some embodiments, the camera module further comprises a housing surrounding the lens driving mechanism and comprising a metal.

In some embodiments, the housing and the base are connected to each other by welding.

BRIEF DESCRIPTION OF DRAWINGS

The invention can be more fully understood by reading the subsequent detailed description and examples with references made to the accompanying drawings, wherein.

DETAILED DESCRIPTION OF INVENTION

The making and using of the embodiments of the camera module are discussed in detail below. It should be appreciated, however, that the embodiments provide many applicable inventive concepts that can be embodied in a wide variety of specific contexts. The specific embodiments discussed are merely illustrative of specific ways to make and use the embodiments, and do not limit the scope of the disclosure.

Unless defined otherwise, all technical and scientific terms used herein have the same meaning as commonly understood by one of ordinary skill in the art to which this invention belongs. It should be appreciated that each term, which is defined in a commonly used dictionary, should be interpreted as having a meaning conforming to the relative skills and the background or the context of the present disclosure, and should not be interpreted in an idealized or overly formal manner unless defined otherwise.

Figure 1:
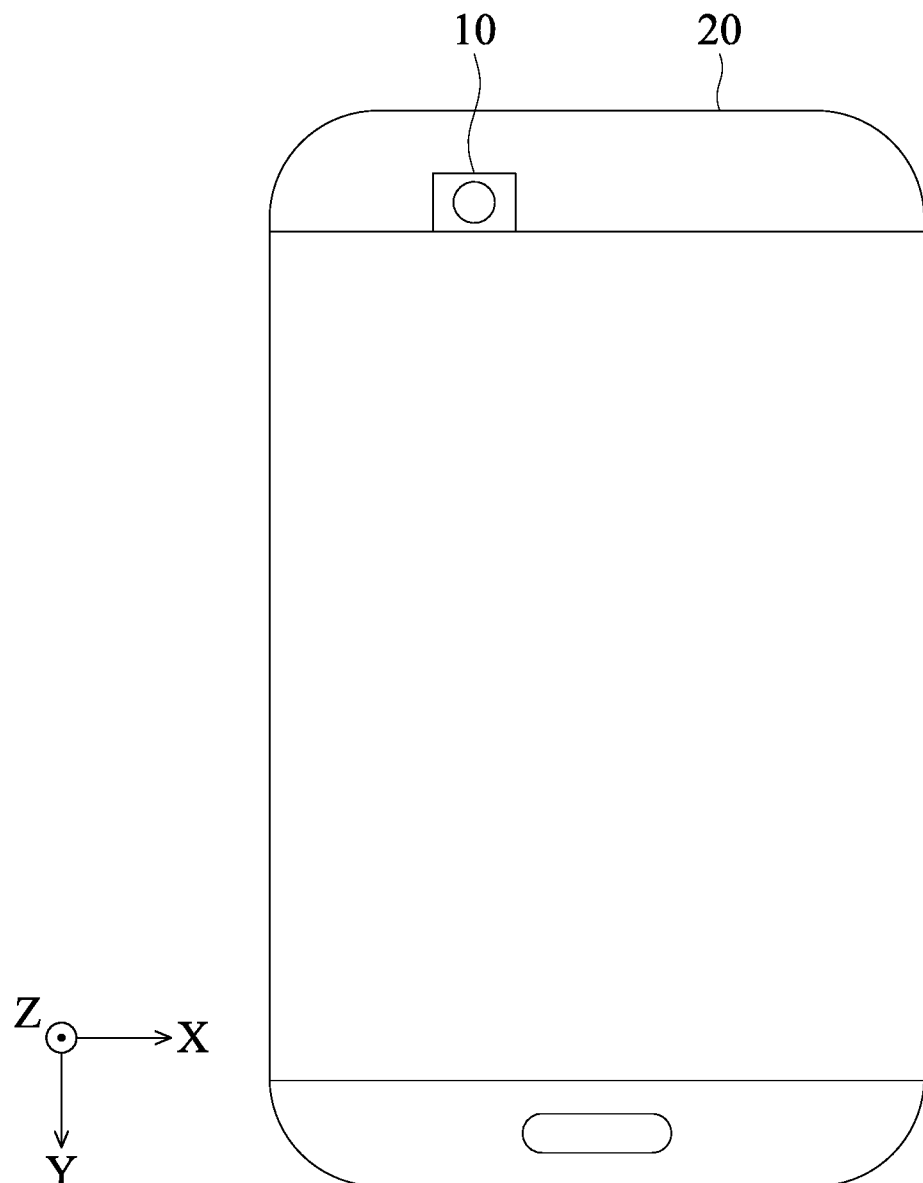
FIG. 1 is a schematic diagram of an electronic device according to an embodiment of the invention.

Referring to FIG. 1, in an embodiment of the invention, the camera module 10 can be disposed in an electronic device 20 and used to take photographs or record video. The electronic device 20 can be a smartphone or a digital camera, for example. When taking photographs or recording video, the camera module 10 can receive the light and form an image, wherein the image can be transmitted to a processor (not shown) in the electronic device 20, where post-processing of the image can be performed.

Figure 2:
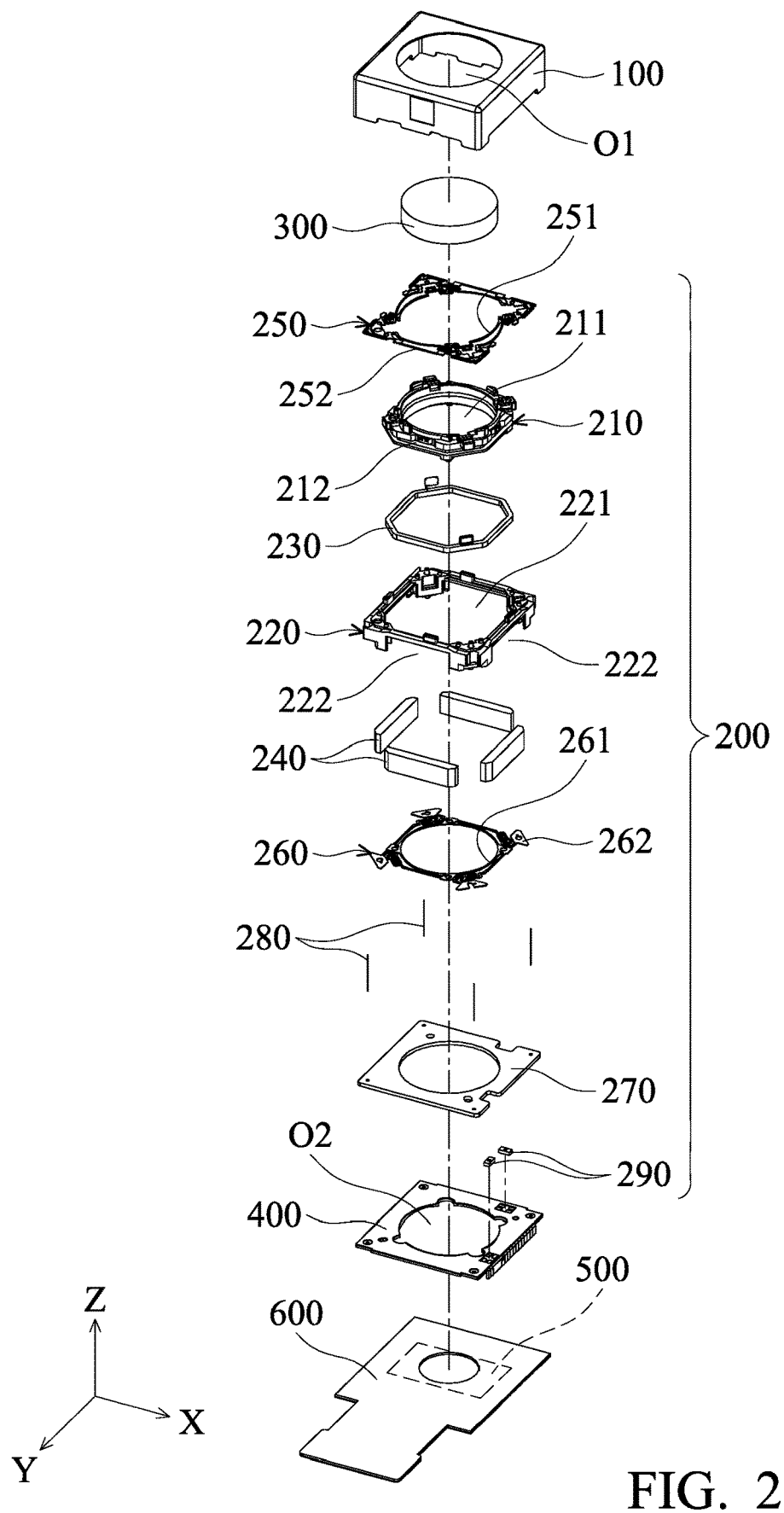
FIG. 2 is an exploded-view diagram of a camera module according to an embodiment of the invention.

As shown in FIG. 2, the camera module 10 primarily comprises a housing 100, a lens driving mechanism 200, a lens unit 300, a base 400, an image sensor 500, and a circuit board 600. The housing 100 and the base 400 can form a hollow box, and the housing 100 surrounds the lens driving mechanism 200. Therefore, the lens driving mechanism 200, the lens unit 300, and the base 400 can be accommodated in the aforementioned box. The image sensor 500 and the circuit board 600 are disposed on a side of the box, and the housing 100 and the base 400 respectively have an opening O1 and an opening O2. The light can reach the image sensor 500 through the opening O1, the lens unit 300, and the opening O2 in sequence, so as to form an image on the image sensor 500.

The lens driving mechanism 200 comprises a lens holder 210, a frame 220, at least one first electromagnetic driving assembly 230, at least one second electromagnetic driving assembly 240, a first elastic member 250, a second elastic member 260, a coil board 270, a plurality of suspension wires 280, and a plurality of position detectors 290.

The lens holder 210 has an accommodating space 211 and a concave structure 212, wherein the accommodating space 211 is formed at the center of the lens holder 210, and the concave structure 212 is formed on the outer wall of the lens holder 210 and surrounds the accommodating space 211. The lens unit 300 can be affixed to the lens holder 210 and accommodated in the accommodating space 211. The first electromagnetic driving assembly 230 can be disposed in the concave structure 212.

The frame 220 has a receiving portion 221 and a plurality of recesses 222. The lens holder 210 is received in the receiving portion 221, and the second electromagnetic driving assembly 240 is affixed in the recess 222 and adjacent to the first electromagnetic driving assembly 230.

The first elastic member 250 and the second elastic member 260 are respectively disposed on opposite sides of the lens holder 210 and the frame 220, and the lens holder 210 and the frame 220 can be disposed therebetween. The inner portion 251 of the first elastic member 250 is connected to the lens holder 210, and the outer portion 252 of the first elastic member 250 is connected to the frame 220. Similarly, the inner portion 261 of the second elastic member 260 is connected to the lens holder 210, and the outer portion 262 of the second elastic member 260 is connected to the frame 220. Thus, the lens holder 210 can be hung in the receiving portion 221 of the frame 220 by the first elastic member 250 and the second elastic member 260, and the range of motion of the lens holder 210 in the direction of the Z-axis can also be restricted by the first and second elastic members 250 and 260.

The lens holder 210 and the lens unit 300 disposed thereon can be driven by the electromagnetic induction between the first electromagnetic driving assembly 230 and the second electromagnetic driving assembly 240 to move relative to the frame 220 along the direction of the Z-axis. For example, in this embodiment, the first electromagnetic driving assembly 230 can be a driving coil surrounding the accommodating space 211 of the lens holder 210, and the second electromagnetic driving assembly 240 can comprise at least one magnet. When a current flows through the driving coil (the first electromagnetic driving assembly 230), electromagnetic induction is generated between the driving coil and the magnet. Thus, the lens holder 210 and the lens unit 300 disposed thereon can be driven to move relative to the frame 220 along the direction of the Z-axis, and the purpose of focus adjustment can be achieved.

In some embodiments, the first electromagnetic driving assembly 230 can be a magnet, and the second electromagnetic driving assembly 240 can be a driving coil.

Referring to FIG. 2, the coil board 270 is disposed on the base 400. Similarly, when a current flows through the coil board 270, electromagnetic induction is generated between the coil board 270 and the second electromagnetic driving assembly 240 (or the first electromagnetic driving assembly 230). Thus, the lens holder 210 and the frame 220 can be driven to move relative to coil board 270 along the direction of the X-axis and/or the direction of the Y-axis, and the lens unit 300 can be driven to move relative to image sensor 500 along the direction of the X-axis and/or the direction of the Y-axis. The purpose of image stabilization can be achieved.

In this embodiment, the camera module 10 comprises four suspension wires 280. Four suspension wires 280 are respectively disposed on the four corners of the coil board 270 and connect the coil board 270, the base 400 and the first elastic member 250. When the lens holder 210 and the lens unit 300 moves along the direction of the X-axis and/or the direction of the Y-axis, the suspension wires 280 can restrict their range of motion. Moreover, since the suspension wires 280 comprise metal (for example, copper or an alloy thereof), the suspension wires 280 can be used as a conductor, for example, the current can flow into the first electromagnetic driving assembly 230 through the base 400 and the suspension wires 280.

The position detectors 290 are disposed on the base 400, wherein the position detectors 290 can detect the movement of the second electromagnetic driving assembly 240 to confirm the position of the lens holder 210 and the lens unit 300 in the direction of the X-axis and the direction of the Y-axis.

For example, the position detector 290 can be a Hall sensor, a magnetoresistance effect sensor (MR sensor), a giant magnetoresistance effect sensor (GMR sensor), a tunneling magnetoresistance effect sensor (TMR sensor), or a fluxgate sensor.

Figure 3:
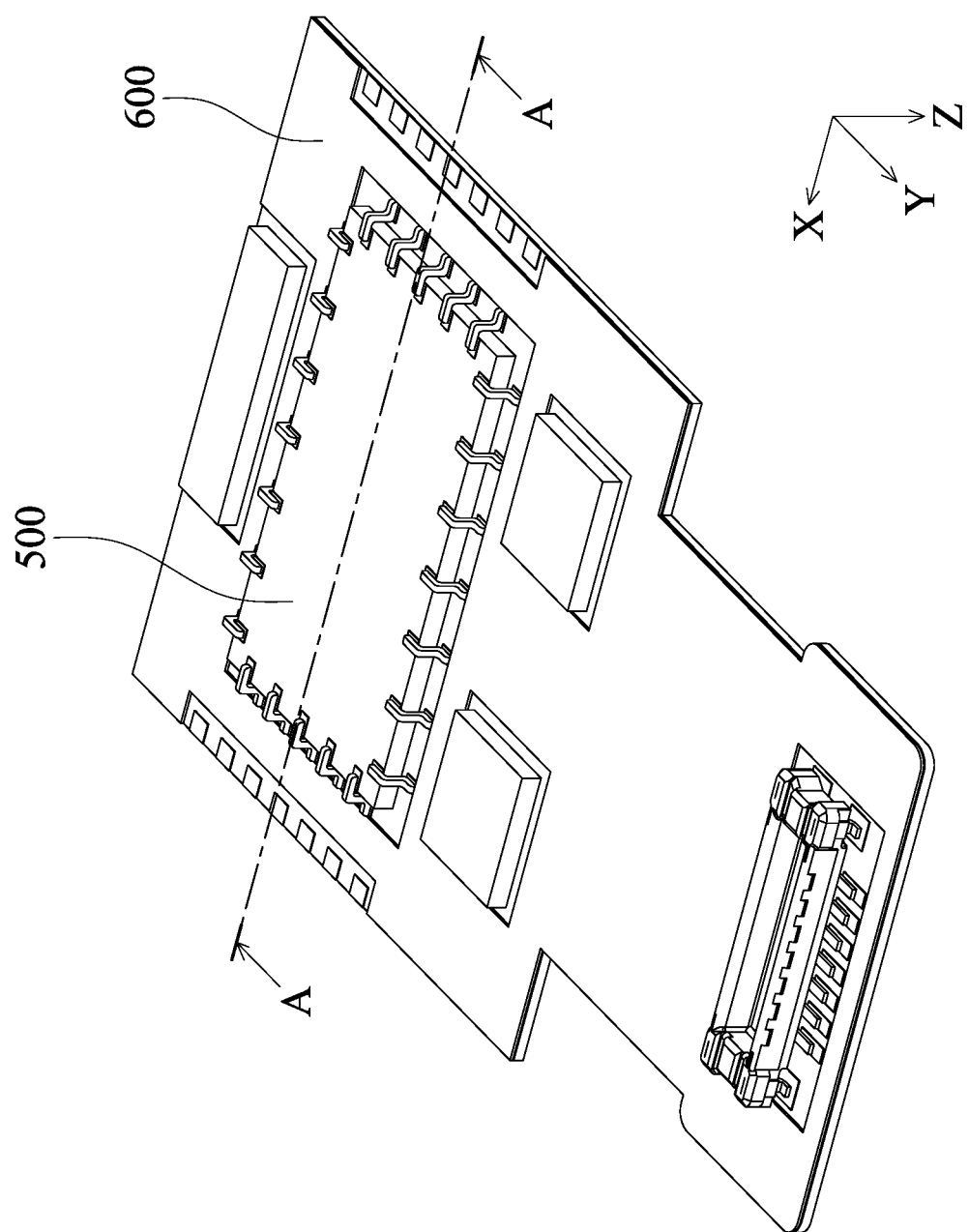
FIG. 3 is a schematic diagram of an image sensor and a circuit board according to an embodiment of the invention.
Figure 4:
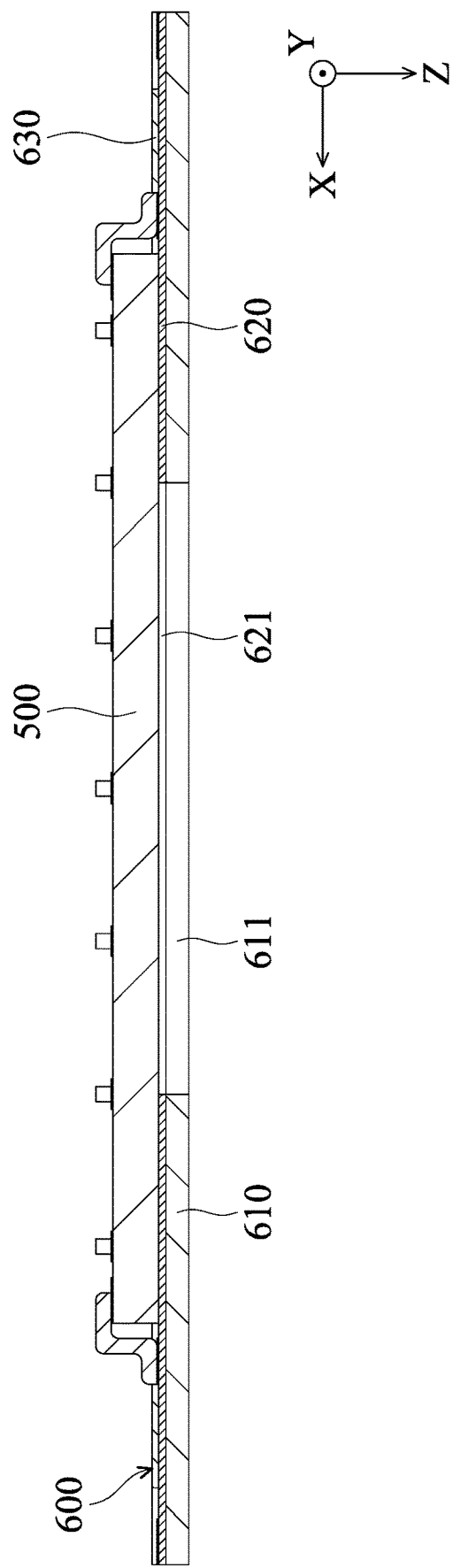
FIG. 4 is a cross-sectional view along the line A-A in FIG. 3.

As shown in FIGS. 3 and 4, the circuit board 600 has three layers, comprising a metal member 610, an insulation layer 620, and a metal wire 630, wherein the insulation layer 620 is disposed between the metal member 610 and the metal wire 630. The image sensor 500 is attached on the insulation layer 620 and electrically connected to the metal wire 630. Furthermore, the metal member 610 and the insulation layer 620 respectively has a hole 611 and a hole 621 which are aligned with each other, and the appearance of the hole 611 is substantially the same as that of the hole 621. The image sensor 500 can catch the light passing through the lens unit 300 via the holes 611 and 621. The conventional circuit board, which is used to support the image sensor, usually has a plastic plate and a coil or wire disposed thereon or embedded therein. Therefore, compared to the conventional circuit board, the structure of the aforementioned circuit board 600 can reduce the height of the camera module 10, and the miniaturized camera module 10 can be achieved.

It should be noted that the thickness of the metal member 610 in the direction of the Z-axis exceeds the total thickness of the insulation layer 620 and the metal wire 630 in the direction of the Z-axis. Therefore, the circuit board 600 has a sufficient hardness and a sufficient flatness, the inclination of the lens unit 300 during the assembly of the camera module 10 can be prevented, and the inclination of the image sensor 500 can be avoided. For example, the thickness of the metal member 610 can be 0.10 mm-0.35 mm. Moreover, the bottom surface of the metal member 610 is exposed without covering. The heat dissipation efficiency of the circuit board 600 and the image sensor 500 can be improved. The metal member 610 and the metal wire 630 can have the same coefficient of thermal expansion, such that when the circuit board 600 is heated, relative displacement is not generated between the metal member 610 and the metal wire 630.

In this embodiment, the metal wire 630 is formed on the insulation layer 620 by using a molded interconnect device (MID), for example, by laser direct structuring (LDS), microscopic integrated processing technology (MIPTEC), laser induced metallization (LIM), laser restructuring print (LRP), an aerosol jet process, or a two-shot molding method. In some embodiments, the metal wire 630 can be formed on the insulation layer 620 by coating.

In some embodiment, the metal wire 630 and the metal member 610 comprise different materials, wherein the metal member 610 has a material with high hardness and the metal wire 630 has a material with high electrical conductivity and thermal conductivity. Thus, the hardness of the metal wire 630 is less than that of the metal member 610, and the electrical conductivity and the thermal conductivity of the metal wire 630 exceed that of the metal member 610.

Figure 5:
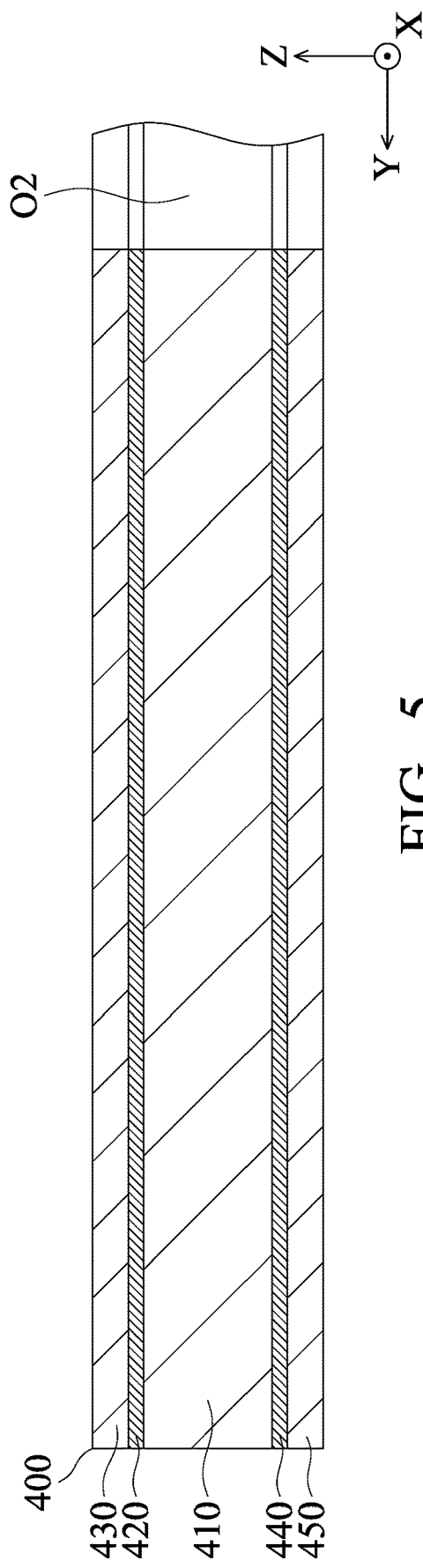
FIG. 5 is a schematic diagram of a base according to an embodiment of the invention.

Referring to FIG. 5, in this embodiment, the base 400 comprises a metal substrate 410, a first insulation layer 420, a first conductive layer 430, a second insulation layer 440, and a second conductive layer 450. The first insulation layer 420 and the second insulation layer 440 are respectively formed on opposite surfaces of the metal substrate 410. The first conductive layer 430 is formed on the first insulation layer 420, and the second conductive layer 450 is formed on the second insulation layer 440. The first conductive layer 430 can be electrically connected to the suspension wires 280, and the second conductive layer 450 can be electrically connected to the image sensor 500.

Similarly, the thickness of the metal substrate 410 in the direction of the Z-axis exceeds the total thickness of the first insulation layer 420 and the first conductive layer 430 in the direction of the Z-axis, and exceeds the total thickness of the second insulation layer 440 and the second conductive layer 450 in the direction of the Z-axis. For example, the thickness of the metal substrate 410 can be 0.10 mm-0.35 mm. The metal substrate 410, the first conductive layer 430, and the second conductive layer 450 can have the same coefficient of thermal expansion, so that when the metal substrate 410 is heated, relative displacement is not generated.

It should be noted that the housing 100 can comprise metal to reduce electromagnetic interference by the camera module 10 of other electronic members in the electronic device 20. Since the base 400 comprises the metal substrate 410, the base 400 can be connected to the housing 100 by welding. The connecting strength between the base 400 and the housing 100 can be enhanced. The separated between the base 400 and the housing 100 due to collision of the camera module 10 can be avoided, and the melting of the plastic and the inclination of the pins due to welding can be prevented.

Figure 6:
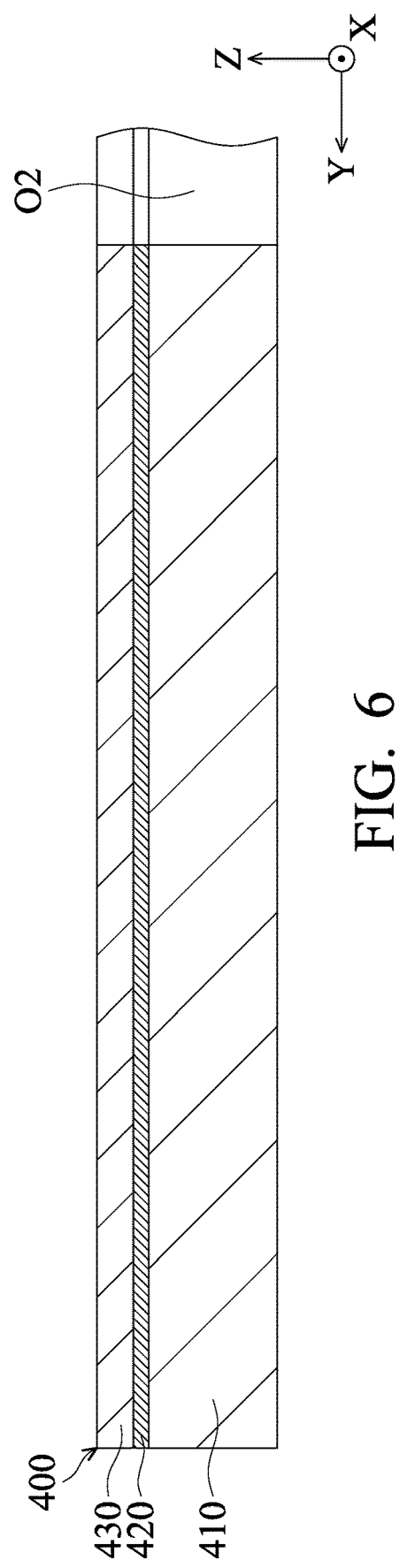
FIG. 6 is a schematic diagram of a base according to another embodiment of the invention.

As shown in FIG. 6, in another embodiment, the base 400 merely comprises a metal substrate 410, a first insulation layer 420, and a first conductive layer 430. The second insulation layer 440 and the second conductive layer 450 can be omitted, and therefore the height of the camera module 10 in the direction of the Z-axis can be reduced. Since the base 400 comprises the metal substrate 410, it has a great flatness. Furthermore, since the metal substrate can be adjacent to or contact the image sensor 500, the heat dissipation efficiency of the image sensor 500 can be improved.

In some embodiments, the bottom 400 can further comprise an outer insulation layer, and the first conductive layer 430 is disposed between the outer insulation layer and the first insulation layer 420. The short circuit between the first conductive layer 430 and the other electronic members can be avoided. It should be noted that the outer insulation layer has one or more openings for electrically connecting.

Figure 7:
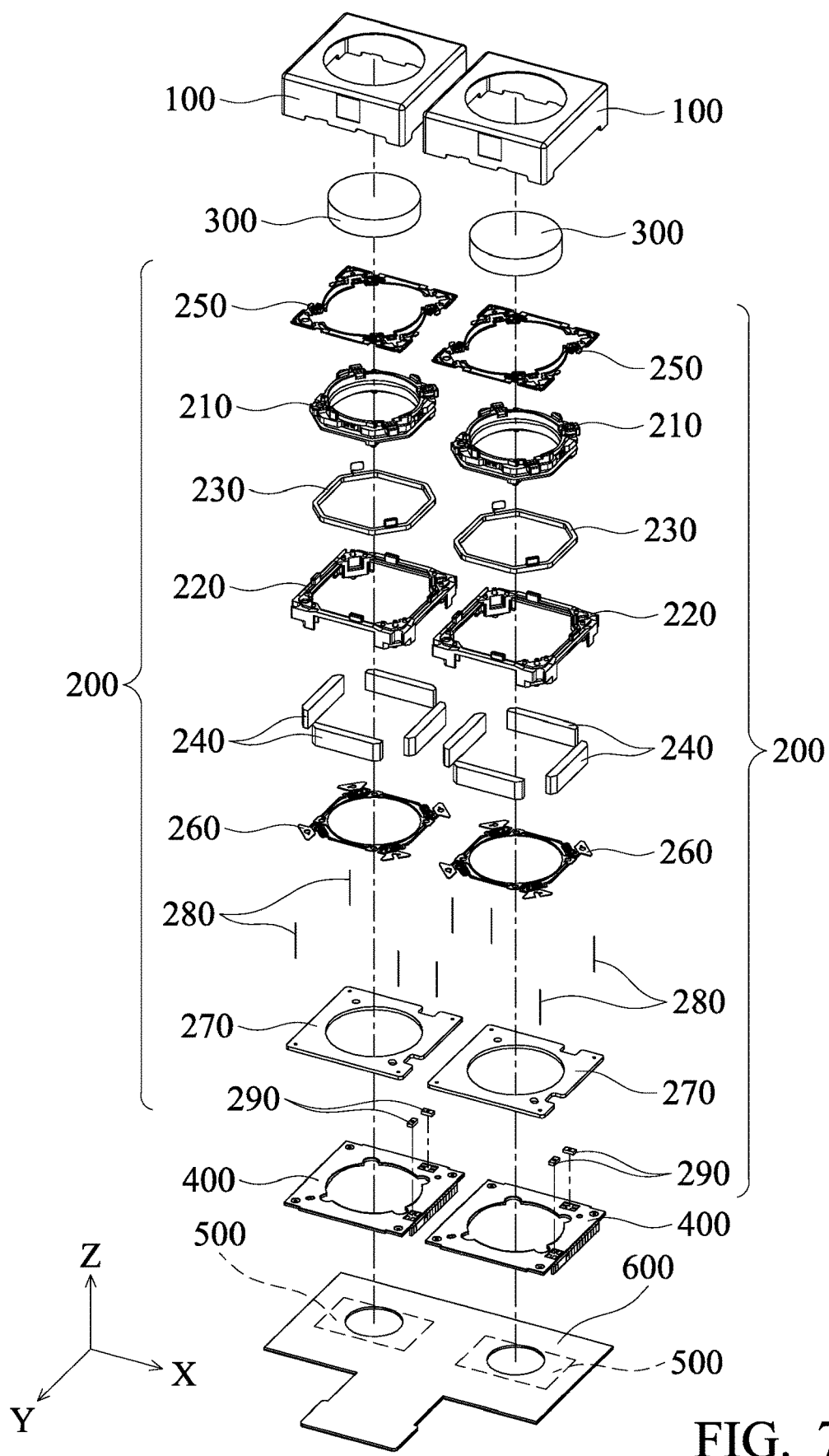
FIG. 7 is a schematic diagram of a camera module according to another embodiment of the invention.

Referring to FIG. 7, in another embodiment, the camera module 10 comprises a plurality of housings 100, a plurality of lens driving mechanisms 200, a plurality of lens units 300, a plurality of bases 400, a plurality of image sensors 500, and a circuit board 600. The image sensors 500 disposed on the circuit board 600 correspond to the lens units 300 on the lens driving mechanisms 200, so that light can pass through the lens unit 300 and form images on the image sensors 500. Since all of the image sensors are disposed on the same circuit board 600 having the metal member 610, the image sensors 500 are substantially coplanar, so as to facilitate the camera module obtaining a plurality of images simultaneously.

In summary, a camera module is provided, wherein the circuit board in the camera module can comprise the metal member, the insulation layer and the metal wire, and the thickness of the metal member exceeds the total thickness of the insulation layer and the metal wire. Since the metal member has sufficient hardness, the image sensor can be flat. Furthermore, the metal member can be used to assist with the heat dissipation of the image sensor.

Furthermore, the electromagnetic wave entering or leaving the camera module can be reduced by the circuit board having the metal member and the base having the metal substrate, so that electromagnetic interference can be reduced. Moreover, since the conductive layers (the metal member 610, the metal wire 630, the metal substrate 410, the first conductive layer 430, the second conductive layer 450) and the non-conductive layers (the insulation layer 620, the first insulation layer 420, the second insulation layer 440) in the circuit board and the base are arranged in a staggered manner, the numbers of the metal boundaries are increased. Thus, the border effect can be enhanced, and the electromagnetic interference can be reduced again. For example, the structure of the circuit board from bottom to top comprises the metal member 610, the insulation layer 620, and the metal wire 630, and the electronic member (such as the image sensor 500) electrically connected to the metal wire 630 can be disposed on the metal wire 630. The structure of the bottom from bottom to top can comprise the metal substrate 410, the first insulation layer 420, and the first conductive layer 430, and the electronic member (such as the position detectors 290) electrically connected to the first conductive layer 430 can be disposed on the first conductive layer 430.

Although some embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, compositions of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps. Moreover, the scope of the appended claims should be accorded the broadest interpretation so as to encompass all such modifications and similar arrangements.

While the invention has been described by way of example and in terms of preferred embodiment, it is to be understood that the invention is not limited thereto. On the contrary, it is intended to cover various modifications and similar arrangements (as would be apparent to those skilled in the art). Therefore, the scope of the appended claims should be accorded the broadest interpretation to encompass all such modifications and similar arrangements.

What is claimed is:

1. A camera module, comprising:
    a lens unit, has an optical axis;
    a base, disposed on a side of the lens unit, and having an opening corresponding to the optical axis;
    a circuit board, comprising:
        a metal member, having a plate structure;
        an insulation layer, disposed on the metal member; and
        a metal wire, disposed on the insulation layer, wherein the metal wire and the metal member are electrically independent; and
    an image sensor, corresponding to the lens unit and disposed on the circuit board, wherein the base is disposed on the circuit board and between the metal member and the lens unit, wherein the metal member has a surface perpendicular to the optical axis and facing the lens unit and the base, and the base and the surface are partially overlapped as observed from the optical axis;
    a first driving assembly, electrically connected to the base and configured to drive the lens unit to move along a first direction relative to the image sensor, wherein the surface faces the first driving assembly, and the first driving assembly and the surface are partially overlapped as observed from the optical axis; and
    a second driving assembly, configured to drive the lens unit to move along a second direction relative to the image sensor, wherein the first direction is different from the second direction.

2. The camera module as claimed in claim 1, wherein the dimensions of the metal member along the optical axis exceed the total dimensions of the insulation layer and the metal wire along the optical axis.

3. The camera module as claimed in claim 2, wherein the thickness of the metal member is 0.10 mm-0.35 mm.

4. The camera module as claimed in claim 1, wherein the insulation layer is disposed between the image sensor and the metal wire, and the image sensor and the metal member are electrically independent.

5. The camera module as claimed in claim 1, wherein the camera module further comprises a housing, an accommodating space can formed by the housing and the base, and the lens unit is disposed in the accommodating space.

6. The camera module as claimed in claim 1, wherein the surface faces the second driving assembly, and the second driving assembly and the surface are partially overlapped as observed from the optical axis.

7. A camera module, comprising:
    a plurality of lens units, wherein each of the lens units has an optical axis;
    a plurality of bases, disposed on a side of the lens units, wherein each of the bases has an opening corresponding to each of the optical axes;
    a circuit board, comprising:
        a metal member, having a plate structure;
        an insulation layer, disposed on the metal member; and
        a metal wire, disposed on the insulation layer, wherein the metal wire and the metal member are electrically independent;
    a plurality of image sensors, corresponding to the lens units and disposed on the circuit board, wherein the base is disposed on the circuit board and between the metal member and the lens units, wherein the metal member has a surface perpendicular to the optical axes and facing the lens units and the base, and the base and the surface are partially overlapped as observed from the optical axes;
    a plurality of bases, wherein the surface faces the bases, the bases and the surface are partially overlapped as observed from the optical axes, and each of the bases has an opening corresponding to image sensors;
    a plurality of first driving assemblies, configured to drive the lens units to move along a first direction relative to the image sensors; and
    a plurality of second driving assemblies, configured to drive the lens units to move along a second direction relative to the image sensors, wherein the first direction is different from the second direction.

8. The camera module as claimed in claim 7, wherein the dimensions of the metal member along the optical axes exceed the total dimensions of the insulation layer and the metal wire along the optical axes.

9. The camera module as claimed in claim 8, wherein the thickness of the metal member is 0.10 mm-0.35 mm.

10. The camera module as claimed in claim 7, wherein the insulation layer is disposed between the image sensors and the metal wire, and the image sensors and the metal member are electrically independent.

11. The camera module as claimed in claim 7, wherein the camera module further comprises a plurality of housings, each of the housings has an accommodating space, and the lens units are disposed in the accommodating spaces.

12. The camera module as claimed in claim 7, the surface faces the second driving assemblies, and the second driving assemblies and the surface are partially overlapped as observed from the optical axes.

* * * * *